United States Patent
Suzuki et al.

(10) Patent No.: US 12,059,731 B1
(45) Date of Patent: Aug. 13, 2024

(54) CUTTING TOOL

(71) Applicant: Sumitomo Electric Hardmetal Corp., Itami (JP)

(72) Inventors: Yuta Suzuki, Itami (JP); Hideaki Kanaoka, Itami (JP); Shinya Imamura, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

(21) Appl. No.: 18/284,863

(22) PCT Filed: Apr. 28, 2023

(86) PCT No.: PCT/JP2023/016837
§ 371 (c)(1),
(2) Date: Sep. 29, 2023

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0641* (2013.01); *C23C 28/042* (2013.01);
(Continued)

(58) Field of Classification Search
CPC ............ B23B 27/148; B23B 2228/105; C23C 14/0641; C23C 14/042; C23C 14/044;
(Continued)

(56) References Cited

U.S. PATENT DOCUMENTS

2014/0193623 A1   7/2014  Setoyama et al.
2018/0099335 A1*  4/2018  Takeshita .............. C23C 28/044
(Continued)

FOREIGN PATENT DOCUMENTS

EP   4215302 A1    7/2023
JP   2008296337 A * 12/2008
(Continued)

OTHER PUBLICATIONS ip.com translation of JP-2008296337-A (Year: 2024).*
(Continued)

*Primary Examiner* — Michael Zhang
(74) *Attorney, Agent, or Firm* — XSENSUS LLP (57) ABSTRACT

A cutting tool includes a substrate and a coating film, including a first layer in which a first unit layer composed of $Ti_aAl_{1-a-b}B_bN$, where $0.30 \leq a \leq 0.50$, and $0 < b \leq 0.10$, and a second unit layer composed of $Ti_cAl_{1-c}N$, where $0.70 \leq c \leq 1.00$, are alternately layered and a second layer in which a third unit layer composed of $Ti_dAl_{1-d-e}B_eN$, where $0.25 \leq d < 0.45$, $0 < e \leq 0.10$, and a fourth unit layer composed of $Ti_fAl_{1-f-g}B_gN$, where $0.35 \leq f < 0.55$, $0 < g \leq 0.10$, are alternately layered, in the first layer, a percentage $(T2/T1) \times 100$ of the number T2 of atoms of titanium to a total T1 of the numbers of atoms of titanium and aluminum is 60% or more, a ratio $I(200)/I(002)$ is 2 or more, and a half width of a peak originated from the (002) plane is 2 degrees or more.

20 Claims, 6 Drawing Sheets

(51) Int. Cl.
  *C23C 14/32* (2006.01)
  *C23C 28/00* (2006.01)
  *C23C 28/04* (2006.01)

(52) U.S. Cl.
  CPC ............ *C23C 28/044* (2013.01); *C23C 28/42* (2013.01); *B23B 2228/105* (2013.01); *C23C 14/325* (2013.01); *Y10T 428/24975* (2015.01); *Y10T 428/264* (2015.01); *Y10T 428/265* (2015.01)

(58) Field of Classification Search
  CPC ................... C23C 14/42; C23C 14/325; Y10T 428/24975; Y10T 428/264; Y10T 428/265
  See application file for complete search history.

(56) References Cited

U.S. PATENT DOCUMENTS

| | | | |
|---|---|---|---|
| 2021/0245259 A1* | 8/2021 | Kido | C23C 16/4584 |
| 2021/0245261 A1* | 8/2021 | Kido | C23C 16/36 |
| 2022/0371099 A1* | 11/2022 | Dobashi | C23C 14/024 |
| 2023/0201930 A1* | 6/2023 | Suzuki | C23C 14/0641 428/212 |
| 2023/0398607 A1* | 12/2023 | Suzuki | C23C 14/325 |
| 2023/0405686 A1* | 12/2023 | Suzuki | C23C 30/005 |
| 2023/0405687 A1* | 12/2023 | Suzuki | C23C 28/42 |

FOREIGN PATENT DOCUMENTS

| | | |
|---|---|---|
| JP | 2011-224717 A | 11/2011 |
| JP | 2018-202505 A | 12/2018 |
| WO | 2014/002948 A1 | 1/2014 |
| WO | 2022/176057 A1 | 8/2022 |

OTHER PUBLICATIONS

Zhang, Chengyu, et al. "Influence of a TiAlN coating on the mechanical properties of a heat resistant steel at room temperature and 650°C." Journal of Wuhan University of Technology-Mater. Sci. Ed. 28.5 (2013): 1029-1033. (Year: 2013).*

International Search Report and Written Opinion mailed on Jun. 6, 2023, received for PCT Application PCT/JP2023/016837, filed on Apr. 28, 2023, 12 pages including English Translation.

* cited by examiner

CUTTING TOOL

CROSS-REFERENCE TO RELATED APPLICATION

The present application is based on PCT filing PCT/JP2023/016837, filed Apr. 28, 2023, the entire contents of which are incorporated herein by reference.

TECHNICAL FIELD

The present disclosure relates to a cutting tool.

BACKGROUND ART

Conventionally, in order to improve performance of a cutting tool, development has been advanced with regard to a coating film that coats a surface of a substrate composed of a cemented carbide, a cubic boron nitride sintered material, or the like (for example, PTL 1).

CITATION LIST

Patent Literature

PTL 1: WO 2022/176057

SUMMARY OF INVENTION

A cutting tool according to the present disclosure includes a substrate and a coating film provided on the substrate, wherein
the coating film includes a first layer and a second layer,
the second layer is provided at a position close to the substrate with respect to the first layer,
the first layer is constituted of a multilayer structure in which a first unit layer and a second unit layer are alternately layered,
an average thickness of the first unit layer is 2 nm or more and 50 nm or less,
an average thickness of the second unit layer is 2 nm or more and 50 nm or less,
the first unit layer is composed of $Ti_aAl_{1-a-b}B_bN$, where $0.30 \leq a \leq 0.50$, and $0 < b \leq 0.10$,
the second unit layer is composed of $Ti_cAl_{1-c}N$, where $0.70 \leq c \leq 1.00$,
in the first layer, a percentage $(T2/T1) \times 100$ of the number T2 of atoms of titanium to a total T1 of the numbers of atoms of titanium and aluminum is 60% or more,
the second layer is constituted of a multilayer structure in which a third unit layer and a fourth unit layer are alternately layered,
an average thickness of the third unit layer is 2 nm or more and 100 nm or less,
an average thickness of the fourth unit layer is 2 nm or more and 100 nm or less,
the third unit layer is composed of $Ti_dAl_{1-d-e}B_eN$,
the fourth unit layer is composed of $Ti_fAl_{1-f-g}B_gN$, where
$0.25 \leq d < 0.45$,
$0 < e \leq 0.10$,
$0.35 \leq f < 0.55$,
$0 < g \leq 0.10$, and
$0.05 \leq f - d \leq 0.20$, and
in an X-ray diffraction spectrum of the second layer, a ratio $I(200)/I(002)$ of a peak intensity $I(200)$ originated from a (200) plane to a peak intensity $I(002)$ originated from a (002) plane is 2 or more, and a half width of a peak originated from the (002) plane is 2 degrees or more.

DETAILED DESCRIPTION

Problem to be Solved by the Present Disclosure

In recent years, a demand for cost reduction has been increased and a tool has been required to have a longer life. For example, a cutting tool having a long tool life has been required also in a turning process for stainless steel.

Thus, it is an object of the present disclosure to provide a cutting tool having a long tool life.

Advantageous Effect of the Present Disclosure

The cutting tool of the present disclosure can have a long tool life.

DESCRIPTION OF EMBODIMENTS

First, embodiments of the present disclosure will be listed and described.

(1) A cutting tool according to the present disclosure includes a substrate and a coating film provided on the substrate, wherein
the coating film includes a first layer and a second layer,
the second layer is provided at a position close to the substrate with respect to the first layer,
the first layer is constituted of a multilayer structure in which a first unit layer and a second unit layer are alternately layered,
an average thickness of the first unit layer is 2 nm or more and 50 nm or less,
an average thickness of the second unit layer is 2 nm or more and 50 nm or less,
the first unit layer is composed of $Ti_aAl_{1-a-b}B_bN$, where $0.30 \leq a \leq 0.50$, and $0 < b \leq 0.10$,
the second unit layer is composed of $Ti_cAl_{1-c}N$, where $0.70 \leq c \leq 1.00$,
in the first layer, a percentage $(T2/T1) \times 100$ of the number T2 of atoms of titanium to a total T1 of the numbers of atoms of titanium and aluminum is 60% or more, the second layer is constituted of a multilayer structure in which a third unit layer and a fourth unit layer are alternately layered, an average thickness of the third unit layer is 2 nm or more and 100 nm or less, an average thickness of the fourth unit layer is 2 nm or more and 100 nm or less, the third unit layer is composed of $Ti_dAl_{1-d-e}B_eN$, the fourth unit layer is composed of $Ti_fAl_{1-f-g}B_gN$, where $0.25 \le d < 0.45$, $0 < e \le 0.10$, $0.35 \le f < 0.55$, $0 < g \le 0.10$, and $0.05 \le f-d \le 0.20$, and in an X-ray diffraction spectrum of the second layer, a ratio I(200)/I(002) of a peak intensity I(200) originated from a (200) plane to a peak intensity I(002) originated from a (002) plane is 2 or more, and a half width of a peak originated from the (002) plane is 2 degrees or more.

The cutting tool of the present disclosure can have a long tool life.

(2) In (1), a nano indentation hardness of the first layer at 25° C. may be 30 GPa or more. This leads to an improved wear resistance of the cutting tool.

(3) In (1) or (2), the average thickness of the first layer may be 1.0 μm or more and 20 μm or less. According to this, the number of the layered first and second unit layers in the first layer is large to result in a further improved effect of suppressing progress of crack. Hence, significant damage of the coating film can be suppressed, with the result that the cutting tool has a long tool life.

(4) In any one of (1) to (3), the average thickness of the second layer may be 0.5 μm or more and 10 μm or less. According to this, the number of the layered third and fourth unit layers in the second layer is large to result in a further improved effect of suppressing progress of crack. Hence, significant damage of the coating film can be suppressed, with the result that the cutting tool has a long tool life.

Details of Embodiments of the Present Disclosure

A specific example of the cutting tool of the present disclosure will be described below with reference to figures. In the figures of the present disclosure, the same reference characters represent the same or corresponding portions. Further, a dimensional relation such as a length, a width, a thickness, or a depth is appropriately changed for clarity and simplification of the figures, and therefore do not necessarily represent an actual dimensional relation.

In the present disclosure, the expression "A to B" represents a range of lower to upper limits (i.e., A or more and B or less), and when no unit is indicated for A and a unit is indicated only for B, the unit of A is the same as the unit of B.

When a compound or the like is expressed by a chemical formula in the present disclosure and an atomic ratio is not particularly limited, it is assumed that all the conventionally known atomic ratios are included, and the atomic ratio should not be necessarily limited only to one in the stoichiometric range.

In the present disclosure, when one or more numerical values are described as each of lower and upper limits of a numerical range, it is assumed that a combination of any one numerical value described as the lower limit and any one numerical value described as the upper limit is also disclosed. For example, in the case where a1 or more, b1 or more, and c1 or more are each described as the lower limit and a2 or less, b2 or less, and c2 or less are each described as the upper limit, it is assumed that a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less are disclosed.

First Embodiment: Cutting Tool

A cutting tool according to one embodiment (hereinafter, also referred to as "first embodiment") of the present disclosure is a cutting tool including a substrate and a coating film provided on the substrate, wherein the coating film includes a first layer and a second layer, the second layer is provided at a position close to the substrate with respect to the first layer, the first layer is constituted of a multilayer structure in which a first unit layer and a second unit layer are alternately layered, an average thickness of the first unit layer is 2 nm or more and 50 nm or less, an average thickness of the second unit layer is 2 nm or more and 50 nm or less, the first unit layer is composed of $Ti_aAl_{1-a-b}B_bN$, where $0.30 \le a \le 0.50$, and $0 < b \le 0.10$, the second unit layer is composed of $Ti_cAl_{1-c}N$, where $0.70 \le c \le 1.00$, in the first layer, a percentage (T2/T1)×100 of the number T2 of atoms of titanium to a total T1 of the numbers of atoms of titanium and aluminum is 60% or more, the second layer is constituted of a multilayer structure in which a third unit layer and a fourth unit layer are alternately layered, an average thickness of the third unit layer is 2 nm or more and 100 nm or less, an average thickness of the fourth unit layer is 2 nm or more and 100 nm or less, the third unit layer is composed of $Ti_dAl_{1-d-e}B_eN$, the fourth unit layer is composed of $Ti_fAl_{1-f-g}B_gN$, where $0.25 \le d < 0.45$, $0 < e \le 0.10$, $0.35 \le f < 0.55$, $0 < g \le 0.10$, and $0.05 \le f-d \le 0.20$, and in an X-ray diffraction spectrum of the second layer, a ratio I(200)/I(002) of a peak intensity I(200) originated from a (200) plane to a peak intensity I(002) originated from a (002) plane is 2 or more, and a half width of a peak originated from the (002) plane is 2 degrees or more.

The cutting tool of the present disclosure can have a long tool life. A reason therefor is presumed as follows.

(i) The coating film of the cutting tool of the present disclosure includes the first layer constituted of the multilayer structure in which the first unit layer and the second unit layer are alternately layered. The first unit layer and the second unit layer have compositions different from each other. Therefore, in the vicinity of an interface between the first unit layer and the second unit layer, a crack generated during use of the cutting tool can be suppressed from progressing from the surface of the coating film.

(ii) The first unit layer is composed of $Ti_aAl_{1-a-b}B_bN$ (where $0.30 \le a \le 0.50$ and $0 < b \le 0.10$). The hardness of the first unit layer is improved because a small amount of boron (B) is added to TiAlN. The second unit layer is composed of $Ti_cAl_{1-c}N$ (where $0.70 \leq c \leq 1.00$). The second unit layer has a high titanium (Ti) content ratio and has an excellent high-temperature stability. In the present disclosure, since the first layer is constituted of the multilayer structure in which the first unit layer having the high hardness and the second unit layer having the excellent high-temperature stability are alternately layered, stable hardness can be obtained even at a high temperature and crater wear resistance is improved. Crater wear is wear generated mainly at a rake face of the cutting tool due to frictional heat between the cutting tool and a chip. Further, since the first layer is constituted of the multilayer structure in which the first unit layer having the high hardness and the second unit layer having lower hardness than that of the first unit layer are alternately layered, breakage resistance is also improved. Thus, the crater wear resistance and the breakage resistance of the coating film are improved in a balanced manner, with the result that the cutting tool has a long tool life.

(iii) The first unit layer and the second unit layer are different in terms of Ti content ratio and Al content ratio. Therefore, the first unit layer and the second unit layer have different crystal lattices, and a strain of the crystal lattice is generated in the first layer and the first layer can have high hardness. Thus, the coating film including the first layer can have excellent wear resistance.

(iv) In the first layer, the percentage (T2/T1)×100 of the number T2 of atoms of titanium to total T1 of the number of atoms of titanium and aluminum is 60% or more. According to this, the first layer can have excellent crater wear resistance, with the result that the cutting tool has a long tool life.

(v) The coating film of the cutting tool of the present disclosure includes the second layer constituted of the multilayer structure in which the third unit layer and the fourth unit layer are alternately layered. The third unit layer and the fourth unit layer have compositions different from each other. Therefore, in the vicinity of an interface between the third unit layer and the fourth unit layer, a crack generated during use of the cutting tool can be suppressed from progressing from the surface of the coating film.

(vi) The second layer has a higher aluminum (Al) content ratio and a higher toughness than those of the first layer. Thus, the coating film having the second layer can have excellent breakage resistance.

(vii) The third unit layer and the fourth unit layer are different in terms of Ti content ratio. Therefore, the third unit layer and the fourth unit layer have different crystal lattices, and a strain of the crystal lattice is generated in the second layer and the second layer can have high hardness. Thus, the coating film including the second layer can have excellent wear resistance.

<Cutting Tool>

As long as the cutting tool of the first embodiment is a cutting tool, the shape, purpose of use, and the like thereof are not particularly limited. Examples of the cutting tool according to the first embodiment include a drill, an end mill, an indexable cutting insert for milling, an indexable cutting insert for turning, a metal saw, a gear cutting tool, a reamer, a tap, a crankshaft pin milling insert, and the like.

Figure 1:
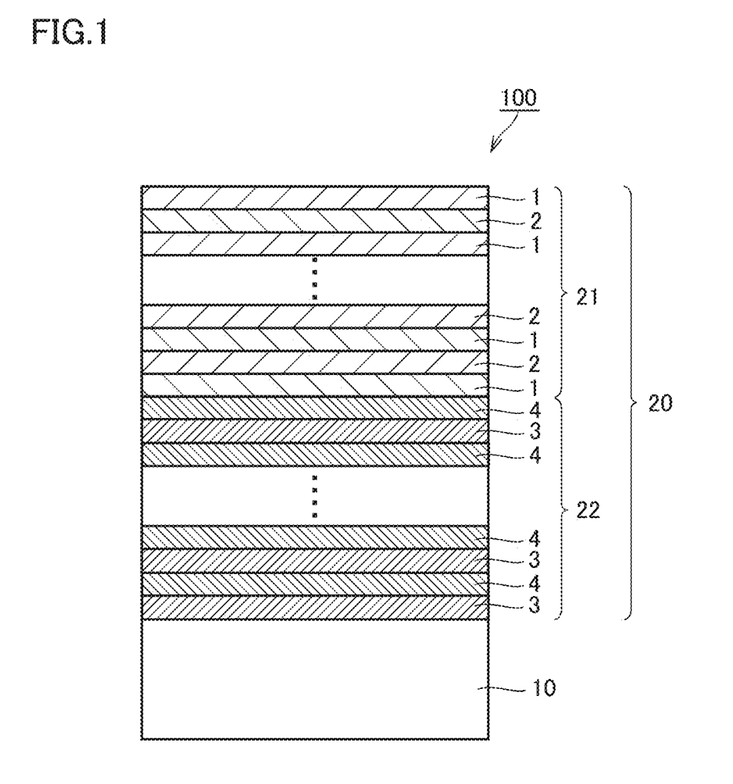
FIG. 1 is a schematic cross sectional view showing an exemplary configuration of a cutting tool according to a first embodiment.

FIG. 1 is a schematic partial cross sectional view showing an exemplary configuration of the cutting tool according to the first embodiment. A cutting tool 100 includes a substrate 10 and a coating film 20 provided on substrate 10. Coating film 20 includes a first layer 21 and a second layer 22. Second layer 22 is provided at a position close to substrate 10 with respect to first layer 21. First layer 21 is constituted of a multilayer structure in which first unit layers 1 and second unit layers 2 are alternately layered. Second layer 22 is constituted of a multilayer structure in which third unit layers 3 and fourth unit layers 4 are alternately layered.

<<Substrate>>

Substrate 10 is not particularly limited. Substrate 10 can be composed of, for example, a cemented carbide, cermet, high-speed steel, ceramic, cubic boron nitride sintered material, diamond sintered material, or the like. Substrate 10 is preferably composed of the cemented carbide. This is because the cemented carbide has excellent wear resistance.

The cemented carbide is a sintered material including WC (tungsten carbide) grains as a main component. The cemented carbide includes a hard phase and a binder phase. The hard phase contains the WC grains. The binder phase binds the WC grains together. The binder phase contains, for example, Co (cobalt) or the like. The binder phase may further contain, for example, TiC (titanium carbide), TaC (tantalum carbide), NbC (niobium carbide), or the like.

The cemented carbide may contain an impurity inevitably introduced therein in the course of manufacturing. The cemented carbide may also include free carbon or an abnormal layer called "η layer" in its structure. Further, the cemented carbide may be subjected to a surface modification treatment. For example, the cemented carbide may include a β-free layer or the like in its surface.

The cemented carbide may contain 85 mass % or more and 98 mass % or less of the WC grains and 2 mass % or more and 15 mass % or less of Co. The average grain size of the WC grains may be 0.2 μm or more and 4 μm or less.

Co is softer than the WC grains. When a surface of substrate 10 is subjected to ion bombardment treatment, soft Co can be removed as described later. Since the cemented carbide has the above-described composition and the WC grains have the above-described average grain size, an appropriate degree of unevenness is formed in the surface from which the Co has been removed. It is considered that by forming coating film 20 on such a surface, an anchor effect is exhibited to improve adhesion between coating film 20 and substrate 10.

Here, the grain size of each WC grain indicates the diameter of a circle circumscribed around a two-dimensional projection image of the WC grain. The grain size is measured using a scanning electron microscope (SEM) or a transmission electron microscope (TEM). That is, the cemented carbide is cut and the cut surface is observed by the SEM or TEM. In the observation image, the diameter of the circle circumscribed around the WC grain is regarded as the grain size of the WC grain. In the observation image, the grain sizes of 10 or more (preferably 50 or more, and more preferably 100 or more) WC grains randomly extracted are measured, and the arithmetic average value thereof is defined as the average grain size of the WC grains. For the observation, it is desirable to process the cross section of the cut surface by a cross section polisher (CP), a focused ion beam (FIB), or the like.

<<Coating Film>>

Coating film 20 is provided on substrate 10. Coating film 20 may be provided on a portion of the surface of substrate 10, or may be provided on a whole of the surface thereof. It should be noted that coating film 20 is provided at least at a portion of the surface of substrate 10 corresponding to a cutting edge. In the present disclosure, the portion of the surface of substrate 10 corresponding to the cutting edge means a region in a distance of 0.5 mm or less or 2 mm or less from a cutting edge ridgeline in the surface of substrate 10. As long as the effect of the present disclosure is not impaired, a coating film not formed on at least a part of the portion corresponding to the cutting edge is not departed from the scope of the present disclosure.

Coating film 20 includes first layer 21 and second layer 22. Second layer 22 may be provided immediately above substrate 10. First layer 21 may be the outermost layer of coating film 20. Coating film 20 can be constituted of second layer 22 provided immediately above substrate 10 and first layer 21 provided immediately above second layer 22. Coating film 20 may include another layer in addition to first layer 21 and second layer 22 as long as the effect of the present disclosure is not impaired. For example, coating film 20 can include one or both of an underlying layer provided between substrate 10 and second layer 22, and a surface layer provided on the outermost surface of coating film 20. The underlying layer can include at least one layer selected from a group consisting of a TiCN layer, a TiN layer, and a TiCNO layer. The surface layer can include at least one layer selected from a group consisting of a TiC layer, a TiN layer, and a TiCN layer.

The layering configuration of coating film 20 does not need to be uniform across the whole of coating film 20, and may be partially different.

The thickness of coating film 20 may be 1.5 μm or more and 30 μm or less. When the thickness of coating film 20 is 1.5 μm or more, the wear resistance is improved. When the thickness of coating film 20 is 30 μm or less, the breakage resistance is improved. The thickness of coating film 20 may be 2.0 μm or more and 25 μm or less, or may be 3.0 μm or more and 20 μm or less. Here, the thickness of the coating film means the total of the thicknesses of the respective layers included in the coating film. Examples of the "layers included in the coating film" include the first layer, the second layer, the underlying layer, the surface layer, and the like.

The thickness of each of the layers included in the coating film is measured by obtaining a thin-piece sample (hereinafter, also referred to as "cross section sample") with a cross section parallel to the normal direction of the surface of the cutting tool and by observing the cross section sample using a scanning transmission electron microscope (STEM). Examples of the scanning transmission electron microscope include JEM-2100F (trade name) provided by JEOL. An observation magnification for the cross section sample is 5,000× to 10,000×, the thicknesses at five positions of the layer are measured, and the arithmetic average value thereof is defined as the "thickness of each layer".

As long as the measurement is performed for the same cutting tool, it has been confirmed that there are no variations in measurement results even when the measurement positions are arbitrarily selected.

<<First Layer>>

First layer 21 is constituted of the multilayer structure in which first unit layers 1 and second unit layers 2 are alternately layered. The number of the layered layers is not particularly limited as long as each of the average thickness of first unit layers 1 and the average thickness of second unit layers 2 is 2 nm or more and 50 nm or less. The number of the layered layers indicates each of the number of first unit layers 1 included in first layer 21 and the number of second unit layers 2 included therein. The number of the layered layers may be 10 or more and 5000 or less, may be 200 or more and 5000 or less, may be 400 or more and 2000 or less, or may be 500 or more and 1000 or less. In first layer 21, the layer closest to substrate 10 may be first unit layer 1 or second unit layer 2. In first layer 21, the layer farthest away from substrate 10 may be first unit layer 1 or second unit layer 2.

The average thickness of the first layer can be 1.0 μm or more and 20 μm or less. When the average thickness of the first layer is 1.0 μm or more, the wear resistance is improved. When the average thickness of the first layer is 20 μm or less, the breakage resistance is improved. The lower limit of the average thickness of the first layer may be 1.0 μm or more, may be 2.0 μm or more, or may be 3.0 μm or more. The upper limit of the average thickness of the first layer may be 20 μm or less, may be 18 μm or less, may be 16 μm or less, or may be 12 μm or less. The average thickness of the first layer may be 1.0 μm or more and 20 μm or less, may be 2.0 μm or more and 16 μm or less, or may be 3.0 μm or more and 12 μm or less.

<<Average Thickness of First Unit Layers and Average Thickness of Second Unit Layers>>

The average thickness of first unit layers 1 is 2 nm or more and 50 nm or less, and the average thickness of second unit layers 2 is 2 nm or more and 50 nm or less. By alternately layering such thin layers in the first layer, progress of crack can be suppressed. When one or both of the average thickness of first unit layers 1 and the average thickness of second unit layers 2 is less than 2 nm, the compositions of first unit layers 1 and second unit layers 2 may be mixed with each other to reduce the effect of suppressing the progress of crack. When one or both of the average thickness of first unit layers 1 and the average thickness of second unit layers 2 is more than 50 nm, an effect of suppressing delamination may be reduced. The average thickness of the first unit layers and the average thickness of the second unit layers may be the same or different.

The lower limit of the average thickness of the first unit layers is 2 nm or more, may be 4 nm or more, may be 6 nm or more, or may be 8 nm or more. The upper limit of the average thickness of the first unit layers is 50 nm or less, may be 46 nm or less, may be 40 nm or less, or may be 30 nm or less. The average thickness of the first unit layers is 2 nm or more and 50 nm or less, may be 4 nm or more and 40 nm or less, or may be 6 nm or more and 30 nm or less.

The lower limit of the average thickness of the second unit layers is 2 nm or more, may be 4 nm or more, may be 6 nm or more, or may be 8 nm or more. The upper limit of the average thickness of the second unit layers is 50 nm or less, may be 46 nm or less, may be 40 nm or less, or may be 30 nm or less. The average thickness of the second unit layers is 2 nm or more and 50 nm or less, may be 4 nm or more and 40 nm or less, or may be 6 nm or more and 30 nm or less.

Each of the average thickness of the first unit layers and the average thickness of the second unit layers is measured as follows. A thin-piece sample (hereinafter, also referred to as "cross section sample") of the cutting tool with a cross section parallel to the normal direction of the surface of the cutting tool is obtained. The cross section sample is observed using a scanning transmission electron microscope (STEM). Examples of the scanning transmission electron microscope include JEM-2100F (trade name) provided by JEOL. An observation magnification for the cross section sample is appropriately adjusted in accordance with each of the thicknesses of first unit layers 1 and second unit layers 2. For example, the observation magnification can be about 1,000,000×. In one first unit layer, the thicknesses at five positions are measured. The arithmetic average value of the thicknesses at the five positions of the first unit layer is calculated, and the arithmetic average value thereof is defined as the average thickness of the first unit layer. In one second unit layer, the thicknesses at five positions are measured.

For each of five different first unit layers, the average thickness of the first unit layer is measured in the procedure described above. The arithmetic average value of the average thicknesses of the five first unit layers is found. In the present disclosure, the arithmetic average value thereof is defined as the average thickness of the first unit layers. For each of the five different second unit layers, the average thickness of the second unit layer is measured in the procedure described above. The arithmetic average value of the average thicknesses of the five second unit layers is found. In the present disclosure, the arithmetic average value thereof is defined as the average thickness of the second unit layers. Each of the average thickness of the third unit layers and the average thickness of the fourth unit layers as described later is also measured in the same manner as described above.

As long as the measurement is performed for the same cutting tool, it has been confirmed that there are no variations in measurement results even when the measurement positions are arbitrarily selected.

<<Compositions of First Unit Layer and Second Unit Layer>>

In the cutting tool of the present disclosure, the first unit layer is composed of $Ti_aAl_{1-a-b}B_bN$, where $0.30 \leq a \leq 0.50$ and $0 < b \leq 0.10$, and the second unit layer is composed of $Ti_cAl_{1-c}N$, where $0.70 \leq c \leq 1.00$. As long as the effect of the present disclosure is not impaired, the first unit layer can include an impurity in addition to $Ti_aAl_{1-a-b}B_bN$. The first unit layer can be composed of $Ti_aAl_{1-a-b}B_bN$ and an impurity. As long as the effect of the present disclosure is not impaired, the second unit layer can include an impurity in addition to $Ti_cAl_{1-c}N$. The second unit layer can be composed of $Ti_cAl_{1-c}N$ and an impurity. Examples of the impurity include carbon (C) and oxygen (O).

In the first unit layer, the lower limit of a is 0.30 or more, may be 0.36 or more, may be 0.37 or more, or may be 0.39 or more. The upper limit of a is 0.50 or less, may be 0.48 or less, or may be 0.45 or less. a may satisfy $0.36 \leq a \leq 0.48$ or $0.37 \leq a \leq 0.45$.

In the first unit layer, the lower limit of b is more than 0, may be 0.01 or more, 0.02 or more, or 0.05 or more. The upper limit of b is 0.10 or less, may be 0.08 or less, or may be 0.07 or less. b may satisfy $0.01 \leq b \leq 0.08$ or $0.02 \leq b \leq 0.07$.

In the second unit layer, the lower limit of c is 0.70 or more, may be 0.75 or more, may be 0.80 or more, or may be 0.87 or more. The upper limit of c is 1.00 or less, may be 0.95 or less, or may be 0.92 or less. c may satisfy $0.75 \leq d \leq 0.95$ or $0.80 \leq d \leq 0.92$.

Each of a and b in $Ti_aAl_{1-a-b}B_bN$ of the first unit layer and c in $Ti_cAl_{1-c}N$ of the second unit layer is specified by measuring the composition of each layer using energy dispersive X-ray spectrometry (EDX). For the composition analysis, an EDX (TEM-DEX) accompanied with the transmission electron microscope (TEM) is used. Examples of the EDX device include JED-2300 (trademark) provided by JEOL.

The composition analysis is performed in the following procedure. A thin-piece sample (hereinafter, also referred to as "cross section sample") with a cross section parallel to the normal direction of the surface of the cutting tool is obtained. While observing the cross section sample with a TEM, an EDX analysis is performed at each of five arbitrarily selected points in one first unit layer or one second unit layer. The first unit layer and the second unit layer can be distinguished from each other by a contrast difference. Here, it is assumed that the "five arbitrarily selected points" are points selected from different crystal grains. Each of the compositions of the first unit layer and the second unit layer is specified by arithmetically averaging the composition ratios obtained for each element by the measurements at the five points.

For each of five different first unit layers, the composition of the first unit layer is specified in the procedure described above. In the present disclosure, the average of the compositions of the five first unit layers is defined as the composition of the first unit layer, and a and b are specified based on this. For each of five different second unit layers, the composition of the second unit layer is specified in the procedure described above. In the present disclosure, the average of the compositions of the five second unit layers is defined as the composition of the second unit layer, and c is specified based on this. The compositions of the third unit layer and the fourth unit layer described later, d and e in $Ti_dAl_{1-d-e}B_eN$ of the third unit layer, and f and g in $Ti_fAl_{1-f-g}B_gN$ of the fourth unit layer are also measured in the same manner as described above.

As long as the measurement is performed for the same cutting tool, it has been confirmed that there are no variations in measurement results even when the measurement points are arbitrarily selected.

<<Composition of First Layer>>

In the first layer, the percentage (T2/T1)×100 (hereinafter, also referred to as "percentage (T2/T1)×100") of the number T2 of atoms of titanium to total T1 of the numbers of atoms of titanium and aluminum is 60% or more. According to this, the first layer can have excellent crater wear resistance. From the viewpoint of improving the crater wear resistance, the lower limit of the percentage (T2/T1)×100 is 60% or more, may be 60.0% or more, may be 62.2% or more, may be 62.5% or more, may be 63% or more, may be 63.5% or more, or may be 66% or more. From the viewpoint of improving oxidation resistance, the upper limit of the percentage (T2/T1)×100 may be 80% or less, may be 77% or less, may be 76.9% or less, or may be 75% or less. The percentage (T2/T1)×100 may be 60% or more and 80% or less, may be 63% or more and 77% or less, or may be 66% or more and 75% or less.

The percentage (T2/T1)×100 in the first layer is measured by the TEM-EDX. Examples of the EDX device include JED-2300 (trade name) provided by JEOL. The percentage (T2/T1)×100 is measured in the following procedure.

A thin-piece sample (hereinafter, also referred to as "cross section sample") with a cross section parallel to the normal direction of the surface of the cutting tool is obtained. While observing the cross section sample using the TEM, the EDX analysis is performed in the first layer at arbitrarily selected five visual fields so as to measure the percentage (T2/T1)×100 of the number T2 of atoms of titanium to total T1 of the numbers of atoms of titanium and aluminum. Here, the "arbitrarily selected five visual fields" are set so as not to overlap with one another. The range of one visual field is 200×200 nm. In the present disclosure, the arithmetic average of the percentages (T2/T1)×100 obtained by the measurements of the five visual fields is defined as percentage (T2/T1)×100 in the first layer.

As long as the measurement is performed for the same cutting tool, it has been confirmed that there are no variations in measurement results even when the measurement points are arbitrarily selected.

<<Nano Indentation Hardness of First Layer>>

The nano indentation hardness of the first layer at 25° C. may be 30 GPa or more. This leads to an improved wear resistance of the cutting tool. The lower limit of the nano indentation hardness may be 32 GPa or more, or may be 34 GPa or more. The upper limit of nano indentation hardness H is not particularly limited, but may be 60 GPa or less, may be 40 GPa or less, or may be 36 GPa or less from the viewpoint of manufacturing. Nano indentation hardness H may be 30 GPa or more and 60 GPa or less, may be 32 GPa or more and 60 GPa or less, or may be 34 GPa or more and 60 GPa or less.

The nano indentation hardness of the first layer at 25° C. is measured by a nano indentation method in accordance with a standard procedure defined in "ISO 14577-1: 2015 Metallic materials-Instrumented indentation test for hardness and materials parameters-". For a measurement device, "ENT-1100a" provided by Elionix) is used. A pressing load for an indenter is 1 g. In the cross section parallel to the normal direction of the surface of the cutting tool, the indenter is pressed onto the first layer in the direction perpendicular to the cross section (i.e., direction parallel to the surface of the cutting tool).

The above measurement is performed at five positions in one measurement sample. The average value of the nano indentation hardnesses at the five positions is defined as the nano indentation hardness of the first layer. It should be noted that data considered to apparently indicate an abnormal value is excluded.

As long as the measurement is performed for the same cutting tool, it has been confirmed that there are no variations in measurement results even when the measurement points are arbitrarily selected.

<<Diameter of Maximum Inscribed Circle of Crystal Grain of First Layer>>

The first layer is constituted of a plurality of crystal grains, and the diameter of the maximum inscribed circle of each crystal grain may be 5 nm or more and 500 nm or less. This leads to an improved crater wear resistance of the cutting tool. The first layer of the present disclosure may include not only the plurality of crystal grains but also a region that does not constitute a crystal grain (region in which an atomic arrangement is random) as long as the effect of the present disclosure is not impaired.

The upper limit of the diameter of the maximum inscribed circle of the crystal grain may be 500 nm or less, may be 450 nm or less, or may be 400 nm or less from the viewpoint of improving the wear resistance and the breakage resistance. The lower limit of the diameter of the maximum inscribed circle of the crystal grain may be 5 nm or more, may be 7 nm or more, or may be 10 nm or more from the viewpoint of suppressing film hardness from being decreased due to the crystal grain becoming excessively fine. The diameter of the maximum inscribed circle of the crystal grain may be 5 nm or more and 500 nm or less, may be 7 nm or more and 450 nm or less, or may be 10 nm or more and 400 nm or less.

Figure 4:
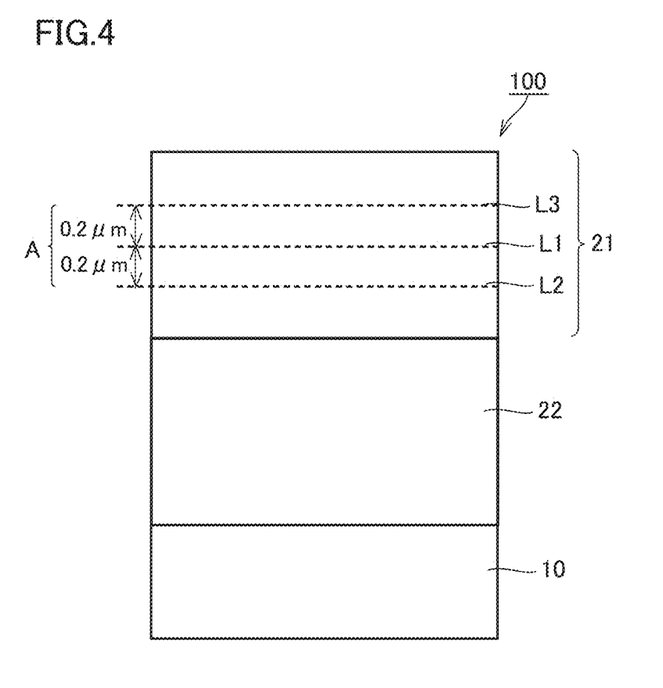
FIG. 4 is a diagram for illustrating a measurement region when measuring a diameter of a maximum inscribed circle of a crystal grain of a first layer.

The diameter of the maximum inscribed circle of the crystal grain is measured in the following manner. A thin-piece sample (thickness: about 10 to 100 nm; hereinafter, also referred to as "cross section sample") of the cutting tool with a cross section parallel to the normal direction of the surface of the cutting tool is obtained. The cross section sample is observed using the transmission electron microscope (TEM) to obtain a bright visual field image. An observation magnification is 1,000,000× to 5,000,000×. As shown in FIG. 4, the bright visual field image is obtained to include a region A sandwiched between a line L2 and a line L3, line L2 being in a distance of 0.2 μm from a line L1 toward the substrate side, line L1 indicating the center of the first layer in the average thickness direction, line L3 being in a distance of 0.2 μm from line L1 toward the surface side of the coating film. A measurement visual field having a quadrangular shape of 150 nm×150 nm is arbitrarily set in region A.

In the above measurement visual field, a region having an atomic arrangement of ±0.5° or less is specified, and the region is defined as a crystal grain. The region having an atomic arrangement of ±0.5° or less and a method of specifying the crystal grain will be described with reference to FIG. 5.

Figure 5:
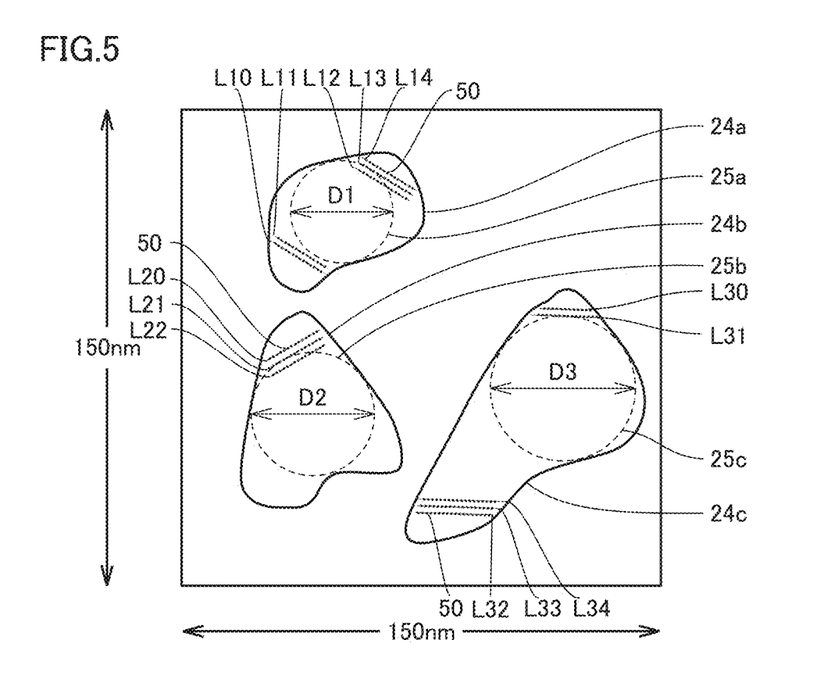
FIG. 5 is a diagram for illustrating a method of measuring the diameter of the maximum inscribed circle of the crystal grain of the first layer, and schematically showing a bright visual field image of a measurement visual field.

FIG. 5 is a schematic view showing an exemplary bright visual field image of the measurement visual field. In FIG. 5, atoms are indicated by black dots each denoted by reference numeral 50. It should be noted that in FIG. 5, parts of the atoms are shown. In the bright visual field image, atoms 50 regularly arranged are connected by line segments to attain the closest interatomic distances. In FIG. 5, the line segments are denoted by L10 to L14, L20 to L22, and L30 to L34. A region in which an angle between the line segments is ±0.5° or less (i.e., −0.5° or more and 0.5° or less) is defined as the crystal grain.

In FIG. 5, each of angles between line segments L10 to L14 is ±0.5° or less, and a region including these line segments corresponds to a crystal grain 24a. Each of angles between line segments L20 to L22 is ±0.5° or less, and a region including these line segments corresponds to a crystal grain 24b. Each of angles between line segments L30 to L34 is ±0.5° or less, and a region including these line segments corresponds to a crystal grain 24c.

The diameter of the maximum inscribed circle of each crystal grain in the measurement visual field is found. The diameter of the maximum inscribed circle means the diameter of the maximum inscribed circle that can be drawn inside the crystal grain and that is in contact with at least part of the outer edge of the crystal grain.

In FIG. 5, the diameter of a maximum inscribed circle 25a of crystal grain 24a is D1. The diameter of a maximum inscribed circle 25b of crystal grain 24b is D2. The diameter of a maximum inscribed circle 25c of crystal grain 24c is D3. When each of D1, D2, and D3 is 50 nm or less, it is confirmed that the first layer shown in FIG. 5 is constituted of the plurality of crystal grains, and the diameter of the maximum inscribed circle of each of the crystal grains is 50 nm or less.

As long as the measurement is performed for the same cutting tool, it has been confirmed that there are no variations in measurement results of the diameters of the maximum inscribed circles of the crystal grains even when the measurement visual field is arbitrarily set.

In FIG. 5, a space exists among crystal grains 24a, 24b, 24c; however, a crystal grain actually exist in the space. Since the thickness of the cross section sample for the TEM is about 10 to 100 nm, information in the depth direction is also reflected in the bright visual field image. In a region in which a plurality of crystal grains overlap with each other in the thickness direction of the sample, a regular atomic arrangement cannot be confirmed on the bright visual field image. Therefore, the region in which the plurality of crystal grains overlap with each other is not determined as a crystal grain in the above-described specifying method.

<<Positional Relation Between Crystal Grain and Each of First and Second Unit Layers>>

Figure 6:
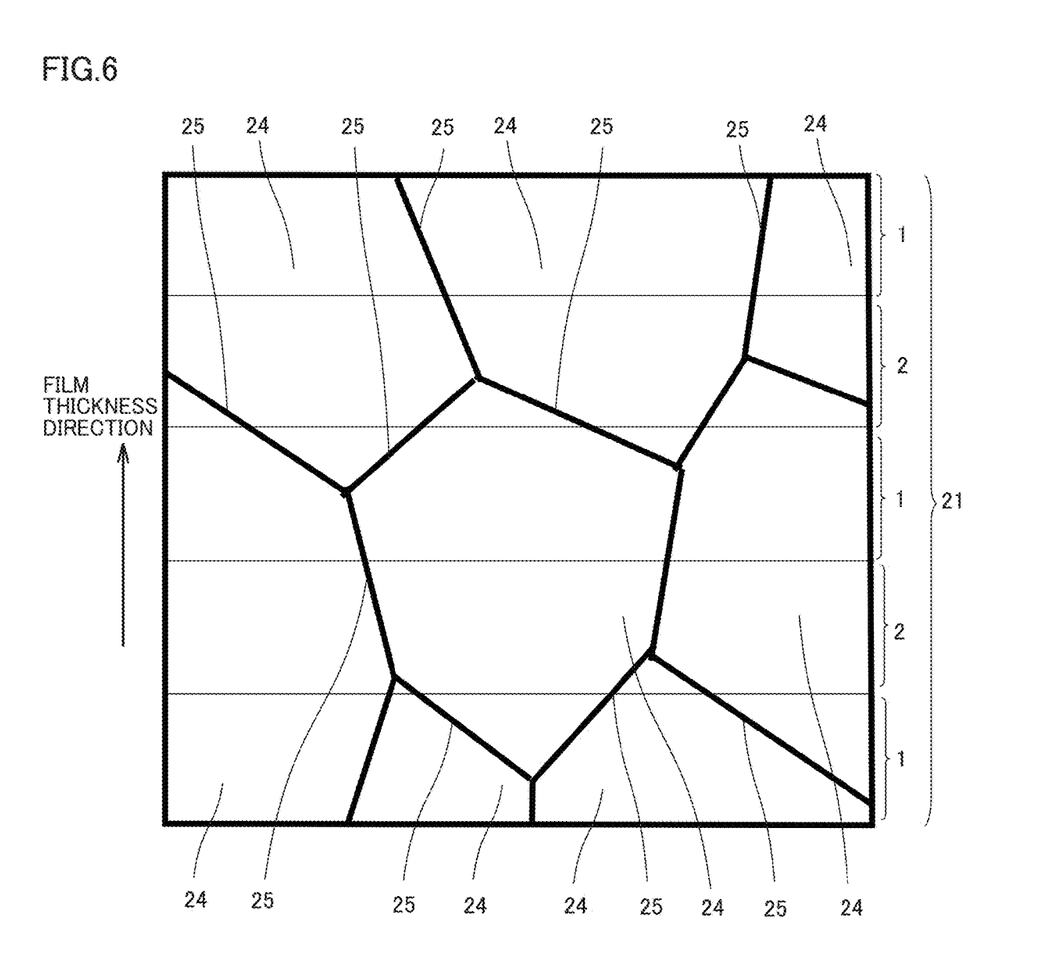
FIG. 6 is a diagram for illustrating a positional relation between the crystal grain and each of first and second unit layers.

A positional relation between a crystal grain and each of the first and second unit layers will be described with reference to FIG. 6. FIG. 6 is a diagram schematically showing a cross section along a film thickness direction of the first layer according to the first embodiment. As shown in FIG. 6, first layer 21 is constituted of the multilayer structure in which first unit layers 1 and second unit layers 2 are alternately layered. FIG. 6 shows a plurality of crystal grains 24, and boundaries between crystal grains 24 are shown as grain boundaries 25. Each crystal grain 24 may be constituted of only a first unit layer or a second unit layer. Further, each crystal grain 24 can exist to extend over one or more first unit layers and one or more second unit layers. That is, each crystal grain 24 can have a lamellar structure in which first and second unit layers are alternately layered.

<<Second Layer>>

Second layer 22 is constituted of the multilayer structure in which third unit layers 3 and fourth unit layers 4 are alternately layered. The number of the layered layers is not particularly limited as long as each of the average thickness of third unit layers 3 and the average thickness of fourth unit layers 4 is 2 nm or more and 50 nm or less. The number of the layered layers indicates each of the number of third unit layers 3 included in second layer 22 and the number of fourth unit layers 4 included therein. The number of the layered layers may be 10 or more and 5000 or less, may be 200 or more and 5000 or less, may be 400 or more and 2000 or less, or may be 500 or more and 1000 or less. In second layer 22, the layer closest to substrate 10 may be third unit layer 3 or fourth unit layer 4. In second layer 22, the layer farthest away from substrate 10 may be third unit layer 3 or fourth unit layer 4.

The average thickness of the second layer can be 0.5 μm or more and 10 μm or less. When the average thickness of the second layer is 0.5 μm or more, the wear resistance is improved. When the average thickness of the second layer is 10 μm or less, the breakage resistance is improved. The lower limit of the average thickness of the second layer may be 1.0 μm or more, may be 2.0 μm or more, or may be 3.0 μm or more. The upper limit of the average thickness of the second layer may be 10 μm or less, may be 9 μm or less, may be 8 μm or less, or may be 7 μm or less. The average thickness of the second layer may be 1.0 μm or more and 9 μm or less, may be 2.0 μm or more and 8 μm or less, or may be 3.0 μm or more and 7 μm or less.

<<Average Thickness of Third Unit Layers and Average Thickness of Fourth Unit Layers>>

The average thickness of third unit layers 3 is 2 nm or more and 100 nm or less, and the average thickness of fourth unit layers 4 is 2 nm or more and 100 nm or less. By alternately layering such thin layers in the second layer, progress of crack can be suppressed. When one or both of the average thickness of third unit layers 3 and the average thickness of fourth unit layers 4 is less than 2 nm, the compositions of third unit layers 3 and fourth unit layers 4 may be mixed with each other to reduce the effect of suppressing the progress of crack. When one or both of the average thickness of third unit layers 3 and the average thickness of fourth unit layers 4 is more than 100 nm, the effect of suppressing delamination may be reduced. The average thickness of the third unit layers and the average thickness of the fourth unit layers may be the same or different.

The lower limit of the average thickness of the third unit layers may be 2 nm or more, may be 5 nm or more, may be 10 nm or more, may be 15 nm or more, or may be 20 nm or more. The upper limit of the average thickness of the third unit layers is 100 nm or less, may be 80 nm or less, may be 75 nm or less, may be 65 nm or less, or may be 64 nm or less.

The average thickness of the third unit layers may be 2 nm or more and 100 nm or less, may be 5 nm or more and 75 nm or less, or may be 10 nm or more and 65 nm or less.

The lower limit of the average thickness of the fourth unit layers may be 2 nm or more, may be 5 nm or more, may be 10 nm or more, may be 15 nm or more, or may be 20 nm or more. The upper limit of the average thickness of the fourth unit layers is 100 nm or less, may be 80 nm or less, may be 75 nm or less, may be 65 nm or less, may be 52 nm or less, or may be 50 nm or less. The average thickness of the fourth unit layers may be 2 nm or more and 100 nm or less, may be 5 nm or more and 75 nm or less, or may be 10 nm or more and 50 nm or less.

Each of the average thickness of the third unit layers and the average thickness of the fourth unit layers is measured by the same method as the above-described method of measuring each of the average thickness of the first unit layers and the average thickness of the second unit layers. As long as the measurement is performed for the same cutting tool, it has been confirmed that there are no variations in measurement results even when the measurement positions are arbitrarily selected.

<<Compositions of Third Unit Layer and Fourth Unit Layer>>

In the cutting tool of the present disclosure, the third unit layer is composed of $Ti_dAl_{1-d-e}B_eN$, where $0.25 \leq d < 0.45$ and $0 < e \leq 0.10$, and the fourth unit layer is composed of $Ti_fAl_{1-f-g}B_gN$, where $0.35 \leq f < 0.55$, $0 < g \leq 0.10$ and $0.05 \leq f-d \leq 0.2$. As long as the effect of the present disclosure is not impaired, the third unit layer may include an impurity in addition to $Ti_dAl_{1-d-e}B_eN$. The third unit layer can be composed of $Ti_dAl_{1-d-e}B_eN$ and an impurity. As long as the effect of the present disclosure is not impaired, the fourth unit layer can include an impurity in addition to $Ti_fAl_{1-f-g}B_gN$. The fourth unit layer can be composed of $Ti_fAl_{1-f-g}B_gN$ and an impurity. Examples of the impurity include carbon (C) and oxygen (O).

In the third unit layer, the lower limit of d is 0.25 or more, may be 0.30 or more, may be 0.31 or more, may be 0.32 or more, may be 0.33 or more, or may be 0.34 or more. The upper limit of d is less than 0.45, may be 0.40 or less, may be 0.37 or less, or may be 0.35 or less. d may satisfy $0.30 \leq d \leq 0.40$ or $0.31 \leq d \leq 0.37$.

In the third unit layer, the lower limit of e is more than 0, may be 0.01 or more, may be 0.02 or more, may be 0.04 or more, or may be 0.05 or more. The upper limit of e is 0.10 or less, may be 0.08 or less, may be 0.07 or less, or may be 0.06 or less. e may satisfy $0.01 \leq e \leq 0.08$ or $0.02 \leq e \leq 0.07$.

In the fourth unit layer, the lower limit of f is 0.35 or more, may be 0.40 or more, may be 0.41 or more, may be 0.42 or more, may be 0.43 or more, or may be 0.45 or more. The upper limit of f is less than 0.55, and may be 0.50 or less. f may satisfy $0.40 \leq f < 0.55$ or $0.45 \leq f \leq 0.50$.

In the fourth unit layer, the lower limit of g is more than 0, and may be 0.01 or more, may be 0.02 or more, or may be 0.04 or more. The upper limit of g is 0.10 or less, may be 0.08 or less, or may be 0.06 or less. g may satisfy $0.01 \leq g \leq 0.10$ or $0.02 \leq g \leq 0.06$.

In the second layer, the lower limit of f−d is 0.05 or more, may be 0.08 or more, may be 0.10 or more, or may be 0.11 or more. The upper limit of f−d is 0.20 or less, and may be 0.18 or less. f−d may satisfy $0.08 \leq f-d \leq 0.18$ or $0.10 \leq f-d \leq 0.18$.

Each of d and e in $Ti_dAl_{1-d-e}B_eN$ of the third unit layer and f and g in $Ti_fAl_{1-f-g}B_gN$ of the fourth unit layer is measured in the same manner as a and b in $Ti_aAl_{1-a-b}B_bN$ of the first unit layer and c in $Ti_cAl_{1-d-e}B_eN$ of the second unit layer. As long as the measurement is performed for the same cutting tool, it has been confirmed that there are no variations in measurement results even when the measurement positions are arbitrarily selected.

<<X-Ray Diffraction Analysis in Second Layer>>

In the X-ray diffraction spectrum of the second layer, ratio I(200)/I(002) of peak intensity I(200) originated from the (200) plane to peak intensity I(002) originated from the (002) plane is 2 or more, and the half width of the peak originated from the (002) plane is 2 degrees or more. According to this, the hardness and toughness of the second layer are improved, with the result that excellent wear resistance and breakage resistance can be obtained. "Peak intensity I(002) originated from the (002) plane" means a diffraction intensity (peak height) at the highest peak of X-ray diffraction peaks originated from the (002) plane of the hexagonal crystal. "Peak intensity I(200) originated from the (200) plane" means a diffraction intensity (peak height) at the highest peak of X-ray diffraction peaks originated from the (200) plane of the cubic crystal. When the peak originated from the (002) plane of the hexagonal crystal exists in the X-ray diffraction spectrum of the second layer, it has been confirmed that the second layer includes a hexagonal crystal structure. When the peak originated from the (200) plane of the cubic crystal exists in the X-ray diffraction spectrum of the second layer, it has been confirmed that the second layer includes a cubic crystal structure. Ratio I(200)/I(002) of 2 or more means that a mixed crystal of the cubic crystal and the hexagonal crystal is formed in the second layer.

Conditions for the X-ray diffraction analysis when measuring peak intensity I(002) and peak intensity I(200) are as follows.

Scan axis: 2θ-θ
X-ray source: Cu-Kα ray (1.541862 Å)
Detector: zero-dimensional detector (scintillation counter)
Tube voltage: 45 kV
Tube current: 40 mA
Incident optical system: use of mirror
Light-receiving optical system: use of analyzer crystal (PW3098/27)
Step: 0.03°
Integration time: 2 seconds
Scan range (2θ): 20° to 80°

At each of the three arbitrary positions in the second layer, X-ray diffraction measurement (XRD measurement) by a θ/2θ method is performed to find an X-ray diffraction intensity of a predetermined crystal plane, and the average value of the found X-ray diffraction intensities at the three predetermined positions is defined as the X-ray diffraction intensity of the predetermined crystal plane. The X-ray diffraction intensity of the (200) plane corresponds to an X-ray diffraction intensity around 2θ=43 to 44°, and the X-ray diffraction intensity of the (002) plane corresponds to an X-ray diffraction intensity around 2θ=30 to 40°. Examples of the device used for X-ray diffraction measurement include "SmartLab" (trade name) provided by Rigaku and "X'pert" (trade name) provided by PANalytical.

The lower limit of ratio I(200)/I(002) is 2 or more, may be 2.0 or more, may be 2.2 or more, or may be 2.3 or more. The upper limit of ratio I(200)/I(002) may be 10 or less, may be less than 10, may be 5 or less, or may be 3 or less, for example. Ratio I(200)/I(002) may be 2 or more and 10 or less, or may be 2 or more and 5 or less.

The expression "the half width of the peak originated from the (002) plane is 2 degrees or more" means that the hexagonal crystals are finely dispersed in the second layer to improve the hardness and toughness. The lower limit of the half width of the peak originated from the (002) plane is 2 degrees or more, may be 2.0 degrees or more, or may be 2.2 degrees or more. The upper limit of the half width of the peak originated from the (002) plane may be 4 degrees or less, or may be 3 degrees or less. The lower limit of the half width of the peak originated from the (002) plane may be 2 degrees or more, may be 2.2 degrees or more, or may be 2.4 degrees or more. The half width of the peak originated from the (002) plane may be 2 degrees or more and 4 degrees or less, or may be 2 degrees or more and 3 degrees or less.

Second Embodiment: Method of Manufacturing Cutting Tool

In a second embodiment, a method of manufacturing the cutting tool of the first embodiment will be described. The manufacturing method of the second embodiment can include: a step of preparing a substrate; and a step of forming a coating film on the substrate. Details of each step will be described below.

<<Step of Preparing Substrate>>

In the step of preparing the substrate, substrate 10 is prepared. The substrate described in the first embodiment can be used as substrate 10.

<<Step of Forming Coating Film>>

In the step of forming the coating film, coating film 20 is formed on substrate 10. In the second embodiment, coating film 20 can be formed by a physical vapor deposition (PVD) method. Specific examples of the PVD method include an arc ion plating (AIP) method, a balanced magnetron sputtering (BMS) method, an unbalanced magnetron sputtering (UBMS) method, and the like. In the second embodiment, it is preferable to use the arc ion plating.

In the AIP method, an arc discharge is generated using a target material as a cathode. Thus, the target material is evaporated and ionized. Then, the ions are deposited on a surface of substrate 10 to which a negative bias voltage has been applied. The AIP method is excellent in terms of a ratio of ionization of the target material.

Figure 2:
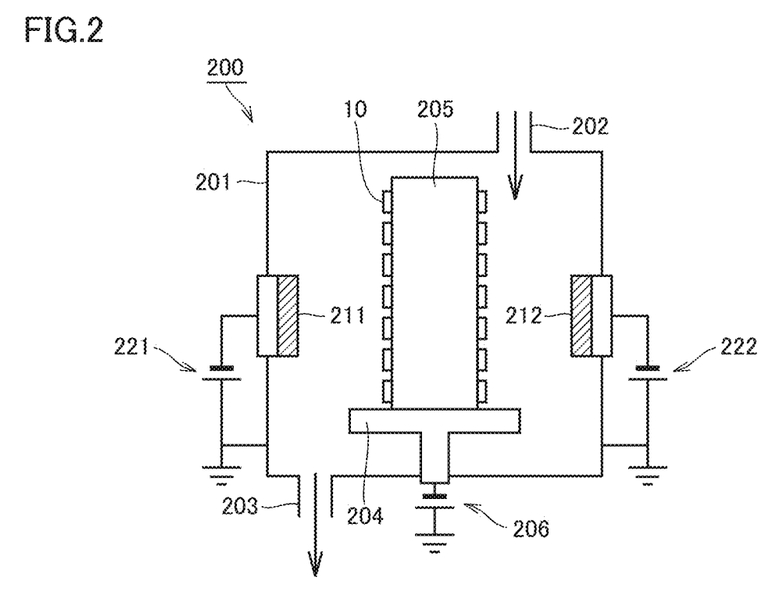
FIG. 2 is a schematic cross sectional view showing an exemplary configuration of a film forming device.

A film forming device used in the AIP method will be described with reference to FIGS. 2 and 3. As shown in FIG. 2, a film forming device 200 includes a chamber 201. Chamber 201 is provided with: a gas introduction port 202 for introducing a source material gas into chamber 201; and a gas exhaust port 203 for exhausting the source material gas from chamber 201 to outside. Gas exhaust port 203 is connected to a vacuum pump (not shown). A pressure in chamber 201 is adjusted by introduction amount and exhaust amount of the gas.

A turntable 204 is disposed in chamber 201. A substrate holder 205 for holding substrate 10 is attached to turntable 204. Substrate holder 205 is connected to the negative electrode of bias power supply 206. The positive electrode of bias power supply 206 is grounded.

Figure 3:
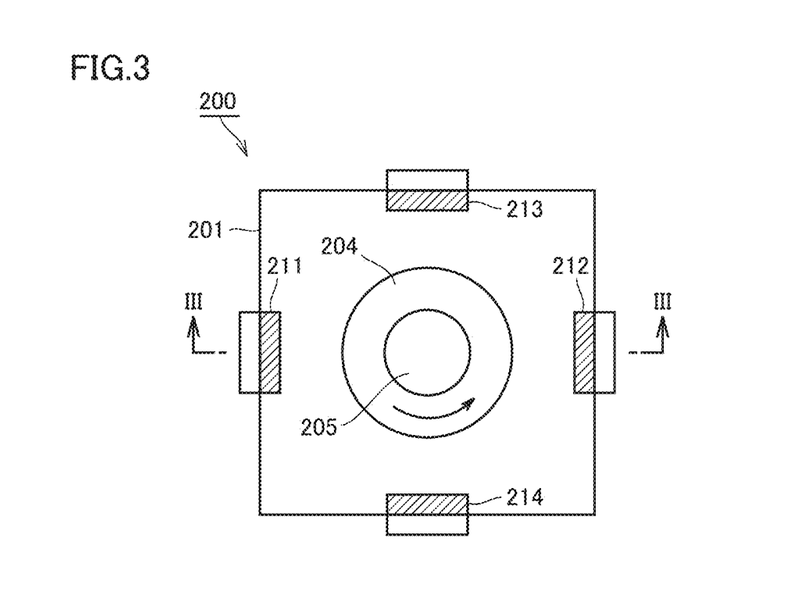
FIG. 3 is a schematic cross sectional view showing the exemplary configuration of the film forming device.

As shown in FIG. 3, a plurality of target materials 211, 212, 213, 214 are attached to a sidewall of chamber 201. As shown in FIG. 2, target materials 211, 212 are connected to the negative electrodes of DC power supplies 221, 222, respectively. Each of DC power supplies 221, 222 is a variable power supply, and has a positive electrode grounded. Although not shown in FIG. 2, the same applies to target materials 213, 214. Hereinafter, specific operations will be described.

Substrate 10 is held by substrate holder 205. A pressure in chamber 201 is adjusted to $1.0 \times 10^{-4}$ Pa using the vacuum pump. The temperature of substrate 10 is adjusted to 500° C. by a heater (not shown) accompanied with film forming device 200, while rotating turntable 204.

An Ar gas is introduced from gas introduction port 202 so as to adjust the pressure in chamber 201 to 3.0 Pa. While maintaining the pressure, the voltage of bias power supply 206 is gradually changed and finally adjusted to −1000 V. Then, the surface of substrate 10 is cleaned by ion bombardment treatment using Ar ions.

Next, when the coating film includes an underlying layer, the underlying layer is formed on the surface of substrate 10. For example, a TiCN layer, a TiN layer, or a TiCNO layer is formed on the surface of substrate 10.

Next, the second layer is formed on the surface of substrate 10 or the surface of the underlying layer. The composition of each target material is selected to obtain the compositions of the third unit layer and the fourth unit layer. Each target material is set at a predetermined position, a nitrogen gas is introduced from gas introduction port 202, and the second layer is formed while rotating turntable 204. When forming the second layer, an arc current of 80 to 200 A is alternately supplied to an evaporation source for forming the third unit layer and an evaporation source for forming the fourth unit layer, while the substrate is maintained at a temperature of 400 to 800° C., the reaction gas pressure is maintained at 1 to 10 Pa (the partial pressure of the nitrogen gas is 5 to 10 Pa), and the voltage of the bias power supply is gradually changed in a range of 30 to 200 V (DC power supply). Thus, metal ions are generated from the evaporation source for forming the third unit layer and the evaporation source for forming the fourth unit layer, with the result that the third unit layer is formed when the substrate faces the evaporation source for forming the third unit layer and the fourth unit layer is formed when the substrate faces the evaporation source for forming the fourth unit layer. Further, by forming a film while changing the voltage of the bias power supply as described above, it is possible to achieve both high hardness of the second layer and cutting edge quality. When a predetermined time has elapsed, the supply of the arc current is stopped. When forming the second layer, the rotation speed of the substrate is adjusted to adjust the thickness of each of the third unit layer and the fourth unit layer. Further, the film formation time is adjusted to adjust the thickness of the second layer to fall within a predetermined range. The second layer may be formed on not only a portion involved in the cutting process (for example, the rake face near the cutting edge) but also the surface of the substrate other than the portion involved in the cutting process.

In one aspect of the present embodiment, an arc current of 80 to 120 A may be alternately supplied to the evaporation source for forming the third unit layer and the evaporation source for forming the fourth unit layer, while the substrate is maintained at a temperature of 500 to 600° C., the reaction gas pressure is maintained at 5 to 10 Pa (the partial pressure of the nitrogen gas is 5 to 8 Pa), and the voltage of the bias power supply is gradually changed in the range of 30 to 200 V (DC power supply). Thus, a mixed crystal structure of the cubic crystal and the hexagonal crystal can be formed in the second layer. With such a mixed crystal structure, each of the crystal grains of the cubic crystal and the hexagonal crystal is suppressed from being coarse, thereby improving the toughness and heat resistance in the second layer.

Next, the first layer is formed on the second layer. The composition of each target material is selected to obtain the compositions of the first unit layer and the second unit layer. Each target material is set at a predetermined position, a nitrogen gas is introduced from gas introduction port 202, and the first layer is formed while rotating turntable 204. Conditions for forming the first layer are as follows.

<Conditions for Forming First Layer>
Substrate temperature: 400 to 800° C.
Bias voltage: −400 to −20 V
Arc current: 80 to 200 A
Reaction gas pressure: 2 to 10 Pa Each of the substrate temperature, the reaction gas pressure, the bias voltage, and the arc current are set to a certain value within the above-described range, or is continuously changed within the above-described range.

The multilayer structure in which the first unit layers and the second unit layers are alternately layered can be formed by appropriately combining the following methods (A) to (D).

(A) In the AIP method, a plurality of target materials (sintered alloys) having different compositions are used.

(B) In the AIP method, during the film formation, the bias voltage applied to substrate 10 is changed within the bias voltage described in the conditions for forming the first layer.

(C) In the AIP method, a gas flow rate is changed.

(D) In the AIP method, substrate 10 is rotated and a rotation cycle thereof is controlled.

Next, when the coating film includes a surface layer, the surface layer is formed on the surface of the first layer, for example.

In this way, cutting tool 100 including substrate 10 and coating film 20 provided on substrate 10 can be manufactured.

EXAMPLES

The present embodiment will be described more specifically with reference to examples. However, the present embodiment is not limited by these examples.

Example 1

<Production of Cutting Tool>

Each of cutting tools was produced in the below-described manner and was evaluated in terms of tool life.

As the substrate, a cutting insert (model number: CNMG120408 (provided by Sumitomo Electric Hardmetal)) composed of a cemented carbide was prepared. The cemented carbide includes WC grains (90 mass %) and Co (10 mass %). The average grain size of the WC grains is 1 to 2 μm.

A film was formed on the substrate by using a film forming device having the configuration shown in FIGS. 2 and 3. First, the substrate was subjected to ion bombardment treatment using Ar ions, thereby cleaning the surface of the substrate. Specific conditions of the ion bombardment treatment are described in the second embodiment.

Next, the target materials were set at predetermined positions of the film forming device. The composition of each target material is adjusted to obtain the compositions of the first unit layer and the second unit layer shown in Table 1 and the compositions of the third unit layer and the fourth unit layer shown in Table 2.

The second layer was formed on the substrate. Specifically, a nitrogen gas was introduced from the gas introduction port, and the third and fourth unit layers were alternately formed while rotating the turntable, thereby forming the second layer. An arc current of 90 A was alternately supplied to the evaporation source for forming the third unit layer and the evaporation source for forming the fourth unit layer, while the substrate was maintained at a temperature of 550° C., the reaction gas pressure was maintained at 8 Pa (the partial pressure of the nitrogen gas: 8 Pa), and the voltage of the bias power supply is gradually changed in the range of 35 to 180 V. The thickness of each of the third and fourth unit layers, the number of the layered third unit layers, and the number of the layered fourth unit layers were adjusted by the rotation speed of the substrate.

Next, the first layer was formed on the second layer. Specifically, a nitrogen gas was introduced from the gas introduction port, and the first and second unit layers were alternately formed while rotating the turntable, thereby forming the first layer on the second layer. The conditions for forming the first layer of each sample were as follows: the substrate temperature was 400 to 800° C.; the bias voltage was −400 to −20 V; the arc current was 80 to 200 A; and the reaction gas pressure was 2 to 10 Pa. Each of the substrate temperature, the reaction gas pressure, the bias voltage, and the arc current was a certain value within a corresponding one of the above-described ranges, or was continuously changed within the corresponding one of the above-described ranges. Each of the thickness of each of the first and second unit layers, the number of the layered first unit layers, and the number of the layered second unit layers were adjusted by the rotation speed of the substrate. By the above steps, the cutting tools of the respective samples were obtained.

<Evaluations>
<<Configuration of Coating Film>>

The coating film of each sample was measured with regard to the compositions, the average thicknesses, the numbers of the layered layers of the first, second, third, and fourth unit layers, the average thickness of each of the first layer and the second layer, the percentage of the number of atoms of titanium to the total of the numbers of atoms of titanium and aluminum in the first layer (shown as "(T2/T1)×100" in Table 1), the nano indentation hardness of the first layer (shown as "Hardness" in Table 1), ratio I(200)/I(002) of the second layer, and the half-value width of the peak originated from the (002) plane (shown as "(002) Peak Half Width" in Table 2). The method of measuring each item is described in the first embodiment. Results are shown in Tables 1 and 2. In Table 1, the notation "1" in "Number of Layered Layers" indicates that only one first unit layer or only one second unit layer was formed. In Table 1, the notation "-" indicates that no corresponding layer was formed.

TABLE 1

| | First Layer | | | | | | | | |
|---|---|---|---|---|---|---|---|---|---|
| | First Unit Layer ($Ti_aAl_{1-a-b}B_bN$) | | | Second Unit Layer ($Ti_cAl_{1-c}N$) | | | | | |
| Sample No. | a | b | Average Thickness [nm] | c | Average Thickness [nm] | (T2/T1) × 100 [%] | Hardness [GPa] | Number of Layered Layers | Average Thickness [μm] |
| 1 | 0.30 | 0.01 | 5 | 0.70 | 15 | 60.0 | 34 | 250 | 5.0 |
| 2 | 0.30 | 0.05 | 2 | 0.95 | 2 | 62.5 | 33 | 250 | 1.0 |
| 3 | 0.30 | 0.10 | 50 | 1.00 | 50 | 65.0 | 31 | 150 | 15.0 |
| 4 | 0.39 | 0.05 | 16 | 0.87 | 15 | 62.2 | 36 | 250 | 7.8 |
| 5 | 0.50 | 0.01 | 2 | 0.70 | 2 | 60.0 | 33 | 500 | 2.0 |
| 6 | 0.50 | 0.10 | 50 | 1.00 | 50 | 75.0 | 30 | 200 | 20.0 |
| 7 | 0.36 | 0.02 | 29 | 0.96 | 38 | 70.0 | 32 | 250 | 16.8 |
| 8 | 0.48 | 0.02 | 30 | 0.98 | 41 | 76.9 | 28 | 200 | 14.2 |
| 9 | 0.39 | 0.05 | 8 | 1.00 | 9 | 71.3 | 34 | 250 | 4.3 |
| 10 | 0.39 | 0.05 | 15 | 0.87 | 16 | 63.8 | 36 | 250 | 7.8 |
| 11 | 0.39 | 0.05 | 14 | 0.87 | 14 | 63.0 | 35 | 250 | 7.0 |
| 12 | 0.37 | 0.05 | 16 | 0.90 | 16 | 63.5 | 37 | 250 | 8.0 |
| 13 | 0.39 | 0.05 | 16 | 0.87 | 15 | 62.2 | 35 | 250 | 7.8 |
| 14 | 0.38 | 0.05 | 12 | 0.92 | 14 | 67.1 | 33 | 250 | 6.5 |
| 15 | 0.39 | 0.05 | 16 | 0.87 | 15 | 62.2 | 35 | 250 | 7.8 |
| 21 | — | — | — | — | — | — | — | — | — |
| 22 | — | — | — | 0.84 | 5100 | 84.0 | 22 | 1 | 5.1 |
| 23 | 0.40 | 0.05 | 4400 | — | — | 40.0 | 33 | 1 | 4.4 |
| 24 | 0.20 | 0.10 | 15 | 0.89 | 25 | 63.1 | 30 | 200 | 8.0 |
| 25 | 0.60 | 0.15 | 15 | 0.90 | 9 | 71.3 | 27 | 300 | 7.2 |
| 26 | 0.48 | 0.05 | 10 | 0.64 | 18 | 58.3 | 32 | 200 | 5.6 |
| 27 | 0.39 | 0.06 | 1 | 0.85 | 1 | 62.0 | 32 | 500 | 1.0 |
| 28 | 0.40 | 0.05 | 60 | 0.84 | 60 | 62.0 | 30 | 100 | 12.0 |

TABLE 2

| | Second Layer | | | | | | | | | |
|---|---|---|---|---|---|---|---|---|---|---|
| | Third Unit Layer ($Ti_dAl_{1-d-e}B_eN$) | | | Fourth Unit Layer ($Ti_fAl_{1-f-g}B_gN$) | | | | (002) Peak Half Value Width [Degree] | Number of Layered Layers | Average Thickness [μm] |
| Sample No. | d | e | Average Thickness [nm] | f | g | Average Thickness [nm] | f-d | I(200)/ I(002) | | |
| 1 | 0.32 | 0.05 | 9 | 0.40 | 0.05 | 9 | 0.08 | 2.6 | 2.2 | 250 | 4.5 |
| 2 | 0.30 | 0.05 | 11 | 0.42 | 0.04 | 10 | 0.12 | 2.5 | 2.4 | 250 | 5.3 |
| 3 | 0.33 | 0.04 | 10 | 0.41 | 0.04 | 9 | 0.08 | 2.4 | 2.3 | 250 | 4.8 |
| 4 | 0.32 | 0.06 | 10 | 0.43 | 0.05 | 10 | 0.11 | 2.5 | 2.4 | 250 | 5.0 |
| 5 | 0.34 | 0.05 | 10 | 0.42 | 0.06 | 10 | 0.08 | 2.4 | 2.3 | 250 | 5.0 |
| 6 | 0.31 | 0.04 | 11 | 0.43 | 0.04 | 10 | 0.12 | 2.6 | 2.2 | 250 | 5.3 |
| 7 | 0.31 | 0.05 | 25 | 0.41 | 0.06 | 24 | 0.10 | 2.5 | 2.2 | 200 | 9.8 |
| 8 | 0.34 | 0.04 | 24 | 0.45 | 0.04 | 27 | 0.11 | 2.6 | 2.2 | 200 | 10.2 |
| 9 | 0.33 | 0.04 | 14 | 0.41 | 0.04 | 13 | 0.08 | 2.3 | 2.3 | 50 | 1.4 |
| 10 | 0.25 | 0.01 | 15 | 0.45 | 0.10 | 11 | 0.20 | 2.9 | 2.7 | 250 | 6.5 |
| 11 | 0.44 | 0.10 | 20 | 0.50 | 0.04 | 15 | 0.05 | 2.4 | 2.4 | 250 | 8.8 |
| 12 | 0.25 | 0.01 | 31 | 0.35 | 0.01 | 30 | 0.10 | 3.4 | 2.0 | 150 | 9.2 |
| 13 | 0.37 | 0.10 | 64 | 0.54 | 0.10 | 52 | 0.18 | 2.0 | 3.5 | 50 | 5.8 |
| 14 | 0.35 | 0.04 | 2 | 0.46 | 0.04 | 2 | 0.11 | 2.3 | 2.4 | 125 | 0.5 |
| 15 | 0.34 | 0.05 | 100 | 0.45 | 0.05 | 100 | 0.11 | 2.4 | 2.3 | 50 | 10.0 |
| 21 | 0.30 | 0.05 | 11 | 0.40 | 0.05 | 10 | 0.10 | 2.6 | 2.2 | 250 | 5.3 |
| 22 | 0.31 | 0.05 | 10 | 0.37 | 0.05 | 9 | 0.06 | 2.6 | 2.2 | 250 | 4.8 |
| 23 | 0.28 | 0.05 | 9 | 0.39 | 0.05 | 9 | 0.11 | 2.6 | 2.2 | 250 | 4.5 |
| 24 | 0.30 | 0.04 | 10 | 0.38 | 0.04 | 10 | 0.08 | 2.6 | 2.2 | 250 | 5.0 |
| 25 | 0.29 | 0.05 | 10 | 0.39 | 0.05 | 11 | 0.10 | 2.6 | 2.2 | 250 | 5.3 |
| 26 | 0.31 | 0.04 | 10 | 0.37 | 0.04 | 10 | 0.06 | 2.6 | 2.2 | 250 | 5.0 |
| 27 | 0.31 | 0.05 | 10 | 0.37 | 0.05 | 9 | 0.06 | 2.6 | 2.2 | 250 | 4.8 |
| 28 | 0.32 | 0.04 | 11 | 0.38 | 0.04 | 11 | 0.06 | 2.6 | 2.2 | 250 | 5.5 |

<<Cutting Test>>

A turning process was performed using the cutting tool of each sample under the following conditions so as to measure a cutting distance until the width of breakage measured from the flank face became 0.5 mm or more. It is indicated that as the cutting distance is longer, the crater wear resistance and the breakage resistance are more excellent and the tool life is longer. Results are shown in the column "Cutting Distance" of "Cutting Test" in Table 3.

(Cutting Conditions)
Workpiece: SUS316, round material
Cutting speed: 200 m/min
Feed amount: 0.2 mm/rev
Cut-in amount: 1.5 mm
Wet type The above cutting conditions correspond to a turning process (high-speed process) for stainless steel.

TABLE 3

| Sample No. | Cutting Test Cutting Distance [km] |
|---|---|
| 1 | 3.6 |
| 2 | 2.4 |
| 3 | 3.0 |
| 4 | 4.0 |
| 5 | 2.8 |
| 6 | 3.0 |
| 7 | 4.4 |
| 8 | 2.6 |
| 9 | 4.0 |
| 10 | 3.2 |
| 11 | 3.2 |
| 12 | 3.6 |
| 13 | 3.6 |
| 14 | 2.8 |
| 15 | 2.6 |

TABLE 3-continued

| Sample No. | Cutting Test Cutting Distance [km] |
|---|---|
| 21 | 1.2 |
| 22 | 1.4 |
| 23 | 2.0 |
| 24 | 2.0 |
| 25 | 1.8 |
| 26 | 2.0 |
| 27 | 1.2 |
| 28 | 1.8 |

<Evaluations>

Samples 1 to 15 correspond to examples of the present disclosure. Samples 21 to 28 correspond to comparative examples. It was confirmed that samples 1 to 15 each had a longer tool life than that of each of samples 21 to 28.

Heretofore, the embodiments and examples of the present disclosure have been illustrated, but it has been initially expected to appropriately combine the configurations of the embodiments and examples and modify them in various manners.

The embodiments and examples disclosed herein are illustrative and non-restrictive in any respect. The scope of the present disclosure is defined by the terms of the claims, rather than the embodiments and examples described above, and is intended to include any modifications within the scope and meaning equivalent to the terms of the claims.

REFERENCE SIGNS LIST

1: first unit layer; 2: second unit layer; 3: third unit layer; 4: fourth unit layer; 10: substrate; 20: coating film; 21: first layer; 22: second layer; 24, 24a, 24b, 24c: crystal grain; 25: crystal grain boundary; 50: atom; 100: cutting tool; 200: film forming device; 201: chamber; 202: gas introduction port; 203: gas exhaust port; 204: rotation table; 205: substrate holder; 206: bias power supply; 211, 212, 213, 214: target material; 221, 222: DC power supply.

The invention claimed is:

1. A cutting tool comprising a substrate and a coating film provided on the substrate, wherein
the coating film includes a first layer and a second layer,
the second layer is provided at a position closer to the substrate than the first layer is to the substrate,
the first layer is constituted of a multilayer structure in which a first unit layer and a second unit layer are alternately layered,
an average thickness of the first unit layer is 2 nm or more and 50 nm or less,
an average thickness of the second unit layer is 2 nm or more and 50 nm or less,
the first unit layer is composed of $Ti_aA1_{1-a-b}B_bN$, where $0.30 \leq a \leq 0.50$, and $0 < b \leq 0.10$,
the second unit layer is composed of $Ti_cAl_{1-c}N$, where $0.70 \leq c \leq 1.00$,
in the first layer, a percentage $(T2/T1) \times 100$ of the number T2 of atoms of titanium to a total T1 of the numbers of atoms of titanium and aluminum is 60% or more,
the second layer is constituted of a multilayer structure in which a third unit layer and a fourth unit layer are alternately layered,
an average thickness of the third unit layer is 2 nm or more and 100 nm or less,
an average thickness of the fourth unit layer is 2 nm or more and 100 nm or less,
the third unit layer is composed of $Ti_dAl_{1-d-e}B_eN$,
the fourth unit layer is composed of $Ti_fAl_{1-f-g}B_gN$, where $0.25 \leq d < 0.45$, $0 < e \leq 0.10$, $0.35 \leq f < 0.55$, $0 < g \leq 0.10$, and $0.05 \leq f-d \leq 0.20$, and
in an X-ray diffraction spectrum of the second layer, a ratio $I(200)/I(002)$ of a peak intensity $I(200)$ originated from a (200) plane to a peak intensity $I(002)$ originated from a (002) plane is 2 or more, and a half width of a peak originated from the (002) plane is 2 degrees or more.

2. The cutting tool according to claim 1, wherein a nano indentation hardness of the first layer at 25° C. is 30 GPa or more.

3. The cutting tool according to claim 1, wherein the average thickness of the first layer is 1.0 μm or more and 20 μm or less.

4. The cutting tool according to claim 1, wherein the average thickness of the second layer is 0.5 μm or more and 10 μm or less.

5. The cutting tool according to claim 1, wherein a satisfies $0.36 \leq a \leq 0.48$.

6. The cutting tool according to claim 1, wherein a satisfies $0.37 \leq a \leq 0.45$.

7. The cutting tool according to claim 1, wherein b satisfies $0.01 \leq b \leq 0.08$.

8. The cutting tool according to claim 1, wherein b satisfies $0.02 \leq b \leq 0.07$.

9. The cutting tool according to claim 1, wherein c satisfies $0.75 \leq c \leq 0.95$.

10. The cutting tool according to claim 1, wherein c satisfies $0.80 \leq c \leq 0.92$.

11. The cutting tool according to claim 1, wherein d satisfies $0.30 \leq d \leq 0.40$.

12. The cutting tool according to claim 1, wherein d satisfies $0.31 \leq d \leq 0.37$.

13. The cutting tool according to claim 1, wherein e satisfies $0.01 \leq e \leq 0.08$.

14. The cutting tool according to claim 1, wherein e satisfies $0.02 \leq e \leq 0.07$.

15. The cutting tool according to claim 1, wherein f satisfies $0.40 \leq f \leq 0.55$.

16. The cutting tool according to claim 1, wherein f satisfies $0.45 \leq f \leq 0.50$.

17. The cutting tool according to claim 1, wherein g satisfies $0.01 \leq g \leq 0.10$.

18. The cutting tool according to claim 1, wherein g satisfies $0.02 \leq g \leq 0.6$.

19. The cutting tool according to claim 1, wherein f–d satisfies $0.08 \leq f-d \leq 0.18$.

20. The cutting tool according to claim 1, wherein f–d satisfies $0.10 \leq f-d \leq 0.18$.

* * * * *